(12) United States Patent
Shuttleworth

(10) Patent No.: US 7,043,313 B1
(45) Date of Patent: May 9, 2006

(54) CLOCK SYSTEM CAPABLE OF SYNCHRONIZING CLOCK FREQUENCIES OF POWER PROCESSING DEVICES AND DIGITAL SIGNAL PROCESSING DEVICES

(75) Inventor: Timothy Shuttleworth, Woodland Hills, CA (US)

(73) Assignee: Harman International Industries, Inc., Northridge, CA (US)

( * ) Notice: Subject to any disclaimer, the term of this patent is extended or adjusted under 35 U.S.C. 154(b) by 1054 days.

(21) Appl. No.: 09/657,833

(22) Filed: Sep. 8, 2000

(51) Int. Cl.
*H04R 3/00* (2006.01)
*H04R 15/00* (2006.01)
*G06F 1/04* (2006.01)
*H03F 1/26* (2006.01)
*H04L 7/00* (2006.01)
*H03L 7/00* (2006.01)

(52) U.S. Cl. .................. 700/94; 381/111; 381/94.1; 713/500; 330/149; 375/354; 327/144

(58) Field of Classification Search .............. 381/111; 330/10, 207 A, 149; 375/238, 354; 332/106; 363/41; 327/144–153; 713/500
See application file for complete search history.

(56) References Cited

U.S. PATENT DOCUMENTS

| | | | | |
|---|---|---|---|---|
| 4,061,909 A | * | 12/1977 | Bryant | 708/845 |
| 4,099,109 A | * | 7/1978 | Abbondanti | 318/811 |
| 4,173,790 A | * | 11/1979 | Abe et al. | 710/36 |
| 5,617,058 A | * | 4/1997 | Adrian et al. | 330/10 |
| 5,883,523 A | * | 3/1999 | Ferland et al. | 324/765 |
| 5,986,426 A | * | 11/1999 | Rowan | 318/599 |

FOREIGN PATENT DOCUMENTS

JP      11191251 A   *   7/1999

* cited by examiner

*Primary Examiner*—Huyen Le
*Assistant Examiner*—Devona E Faulk

(57) ABSTRACT

The present invention synchronizes the clock of the power processing devices and digital signal processing devices in an audio system. The system may include a clock, a digital signal processor (DSP), and a pulse width modulated (PWM) power processing device wherein the digital signal processor and the power processing device would use the clock for their operation. The DSP and the PWM power processing device may use, for operation, the frequency of the clock, or a multiple, integer fraction thereof, such that all clocks are synchronized and all potential sum and/or difference frequencies are predetermined and fall outside the audible frequency range. The may also include a sensor capable of detecting and reporting the clock information either through a metal wire, fiber optic wire, infrared or radio frequency link, which can allow the power processing devices to use the same clock as the DSP.

30 Claims, 3 Drawing Sheets

CLOCK SYSTEM CAPABLE OF SYNCHRONIZING CLOCK FREQUENCIES OF POWER PROCESSING DEVICES AND DIGITAL SIGNAL PROCESSING DEVICES

BACKGROUND OF THE INVENTION

1. Field of Invention

This invention relates generally to a system and method for synchronizing the clock frequencies of power processing devices and digital signal processing devices in an electronic system.

2. Background of the Invention

Power amplifiers and power supplies based upon linear circuit technology have been traditionally inefficient and relatively heavy. Enormous heatsinks, fans, and other cooling methods are usually required to dissipate the power loss while having the undesirable effect of adding to the overall weight of a system.

In recent years, high frequency switching circuit technology, where the switching is based upon some clock with a predetermined frequency, has gained rapid and sophisticated development. Particularly, switching circuits have been developed to use pulse width modulation (PWM) to carry signals and deliver power. The design advantage of a PWM power supply is that small components can be used to rectify and smooth the high-frequency alternating current. The design advantage of a PWM amplifier is that the output devices in a PWM amplifier are unbiased and switch completely off at each half-wave cycle. One of the advantages is that these power supplies and amplifiers are inherently more efficient and run cooler than traditional linear circuit amplifiers and power supplies. A further advantage is that power processing with switching circuits can be accomplished with much less mass than traditional linear power processing circuits.

Electronic systems which employ power supplies and power amplifiers may also employ Digital Signal Processors (DSP) for various types of processing. These processors are also based upon some clock with a predetermined frequency. If the power supply and power amplifier are both pulse width modulated, a problem will likely exist if the Digital Signal Processor's clock is out of sync with the clock on any of the power processing devices. Namely, the difference or sum in clock frequency and/or clock synchronization may generate noticeable noise or induce a difference frequency. In the case of an audio system that employs PWM power processing and Digital Signal Processing, this may translate to audible tones.

Therefore, a need exists for a system and method for synchronizing the clocks of the power processing devices and digital signal processing devices in electronic systems.

SUMMARY OF THE INVENTION

A general feature of the present invention is to provide a system and method for synchronizing the clock of the power processing devices and digital signal processing devices in an audio system. Of course, it is not necessary to the invention that the system be an audio system, rather, any system employing PWM power processing devices where the clocks of those device(s) need to be in sync with the clock of another device such as a digital signal processor may be used.

In one embodiment of the present invention, the system may include a clock, a digital signal processor (DSP), and a pulse width modulated (PWM) power processing device wherein the digital signal processor and the power processing device would use the clock for their operation. The DSP and the PWM power processing device may use, for operation, the frequency of the clock, or a multiple, integer fraction thereof, such that all clocks are synchronized and all potential sum and/or difference frequencies are predetermined and fall outside the audible frequency range.

In another embodiment of the present invention, the system may include a sensor capable of detecting and reporting the clock information either through a metal wire, fiber optic wire, infrared or radio frequency link, which can allow the power processing devices to use the same clock as the DSP.

DETAILED DESCRIPTION OF THE INVENTION

This description is not to be taken in a limiting sense, but is made merely for the purpose of illustrating the general principles of the invention. The section titles and overall organization of the present detailed description are for the purpose of convenience only and are not intended to limit the present invention. Accordingly, the invention will be described with respect to synchronizing clock frequencies in an audio system. It is to be understood that the particular system described herein is for illustration only; the invention also applies to other systems employing PWM (pulse width modulation) power processing devices and Digital Signal Processing devices.

I. Synchronizing the Digital Signal Processor and Power processing devices

Figure 1:
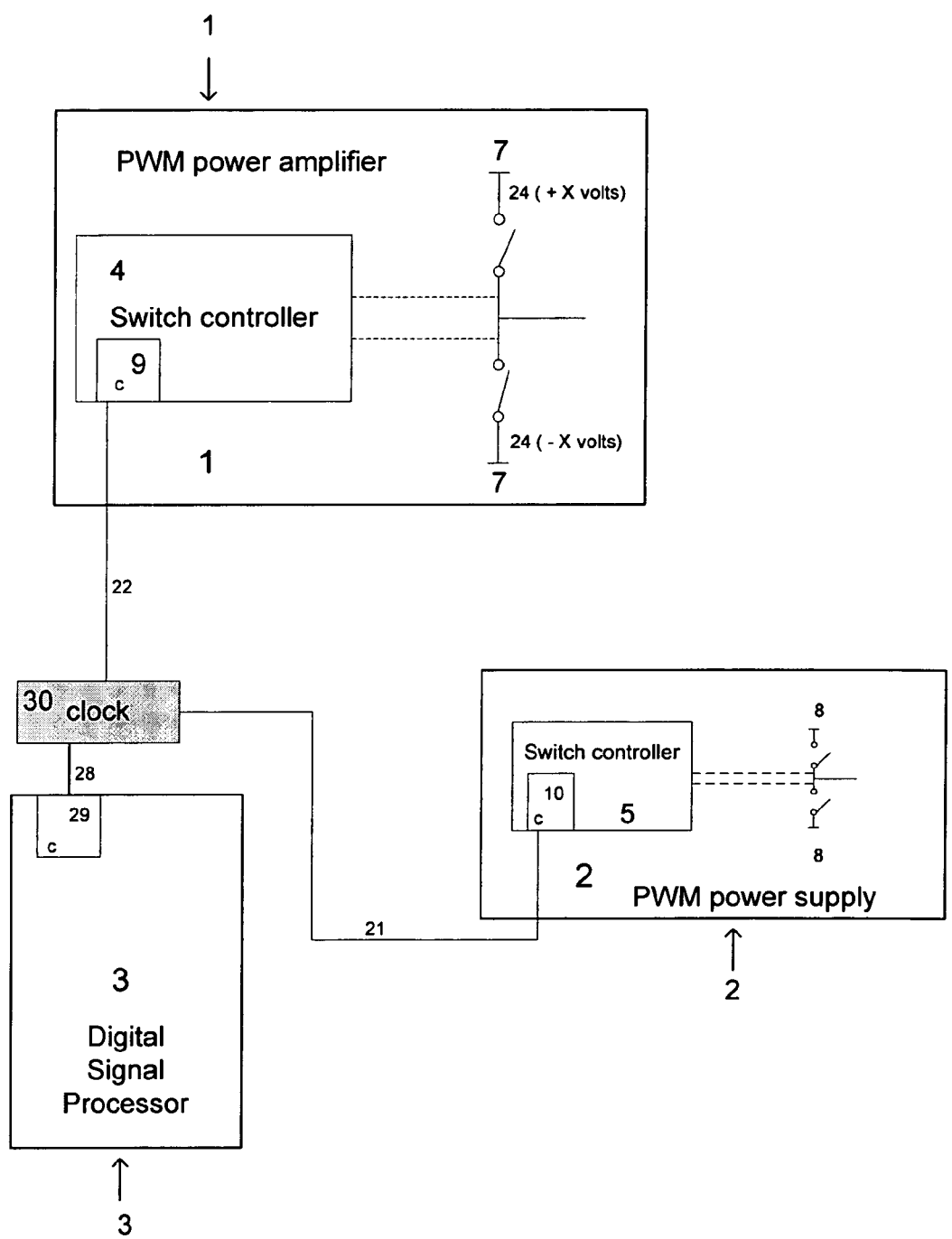
FIG. 1 is an exemplary system diagram in accordance with one embodiment of the present invention, in which a digital signal processor and a pulse width modulated power supply and a pulse width modulated power amplifier use the same clock or integer related derivative of the clock so that all devices based upon the clock are running synchronously.

FIG. 1, illustrates by way of example a simplified system diagram representing one embodiment of the present invention, wherein a PWM power amplifier 1 and a PWM power supply 2 and a DSP 3 use a common clock 30 for their operation.

The design of PWM power amplifiers and power sources is well appreciated in the art and it follows that there are various methods and design choices involved in their construction. However, all pulse width modulation power processing devices will contain a switching controller (4, 5) and/or a switching circuit (7, 8).

At its fundamental level, the PWM power amplifier 1 uses a switching controller 4 and a switching circuit 7 to amplify an audio signal. The switching controller 4 tells the switching circuit when to turn off and on based upon the audio input signal and a clock with a predetermined frequency which results in the creation of a frequency square wave carrier modulated by the audio signal. The amplitude of this modulated signal is constant and determined by the control voltage (24) of the switching circuit 7. Varying the control voltage (24) in turn varies the amplification of the audio signal.

At its fundamental level, the PWM power supply 2, uses a switching controller 5 and switching circuit 8 to convert incoming power to higher frequency pulses by turning the switching circuit on and off, based upon a clock with a predetermined frequency, while at the same time regulating the power by pulse width modulation. Simply, the duration of each power pulse is varied in response to the needs of the circuitry being supplied. The switch controller 5 controls the width of the pulses by turning on and off the switching circuit 8 at a certain rate. Finally, a transformer reduces the switched pulses' voltage to the level required by the circuits and, by rectification and filtering 18, turns it into pure direct current.

The digital signal processor 6 takes as input a signal 15, and through various algorithms digitally processes the signal for an intended result. The fundamental operation of a digital signal processor is based upon a clock with a predetermined frequency.

Each electronic component; namely, the PWM power supply, the PWM power amplifier, and the DSP use the clock 30 for their operation. The frequency of the clock, for example, may be 96 kHz because it is an industry standard as a clock frequency for DSP's. However, other frequencies may be used such as 44.1 kHz to 48 kHz and 88.2 kHz. Each component receives the clock signal at a clock signal input (9, 10, 29) via a clock signal link (22, 21, 28). The clock signal link may be a wire link, a fiber optic link, or an electromagnetic link. Each component may use the actual frequency being generated by the clock 30, or a multiple, or integer fraction thereof, such that all of the components (1, 2 and 3) are synchronized and all potential sum and/or difference frequencies may be predetermined and fall outside the audible frequency range. For example, the DSP may run at 96 kHz or 48 kHz, while the PWM power amplifier may run at 192 kHz.

Figure 2:
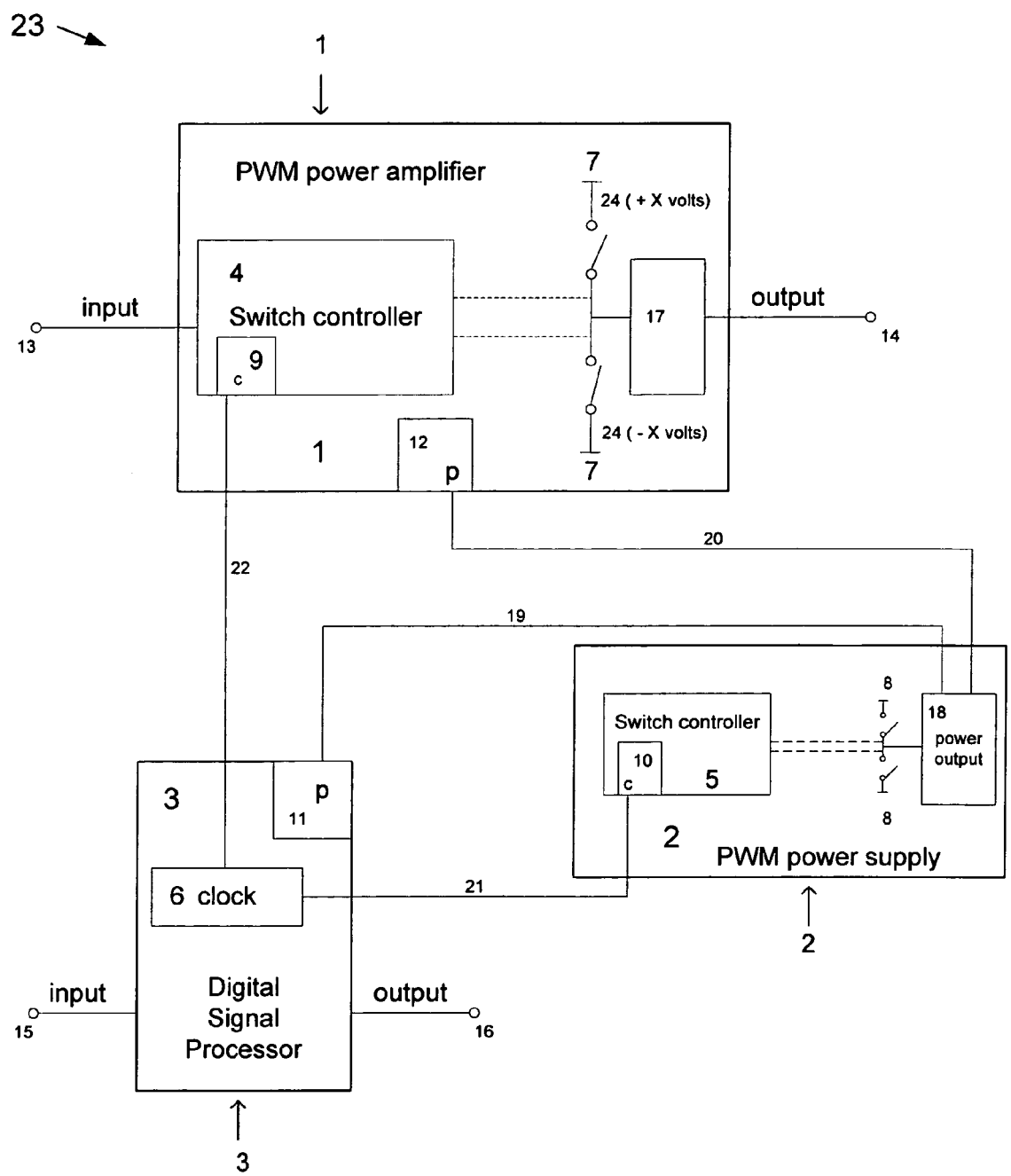
FIG. 2 is an exemplary system diagram in accordance with one embodiment of the present invention, in which a digital signal processor and a pulse width modulated power supply and a pulse width modulated power amplifier use the clock inside the digital signal processor or integer related derivative of the clock so that all devices based upon a clock are running synchronously.

FIG. 2, illustrates by way of example a simplified system diagram representing a further embodiment of the present invention, wherein a PWM (pulse width modulated) power amplifier 1 and a PWM power supply 2 derive their clock frequencies from the clock 6 inside the Digital Signal Processor 2.

As discussed above, all three electrical components (1,2 and 3) use the same clock for their operation. However, within this embodiment, the clock 6 is located inside the DSP 3. The clock frequency of the Digital Signal Processor is fixed to a predetermined industry standard, whereas in PWM power processing devices, the clock frequency may be fixed to an arbitrary number within a predetermined range. Therefore, in this embodiment all electrical components use the clock inside the DSP.

Figure 3:
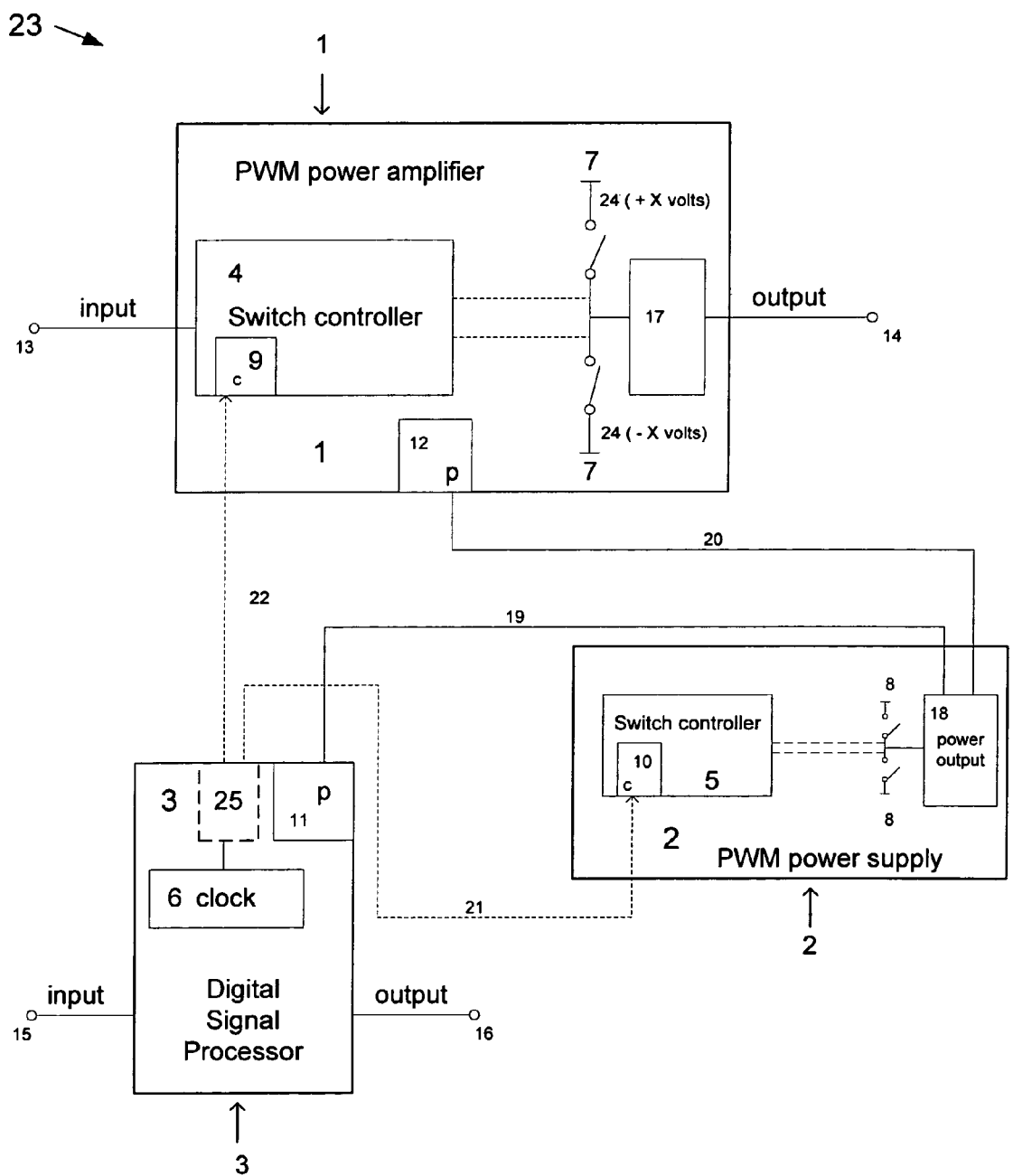
FIG. 3 is an exemplary system diagram in accordance with one embodiment of the present invention, in which a digital signal processor and a pulse width modulated power supply and a pulse width modulated power amplifier derive their clock frequencies from the clock inside the digital signal processor via an electromagnetic communication link so that all devices based upon a clock are running synchronously.

The power supply 3 supplies the power for the power amplifier 1 at the power input 12 and supplies the power for the digital signal processor 3 at the power input 11. The clock 6 in the digital signal processor 1 is also used by the PWM power amplifier 1 and the PWM power supply 2 so as to synchronize the power processing devices with the digital signal processor. The clock signal is received in the PWM power amplifier and the PWM power supply at the clock inputs 9 and 10 respectively. The connection lines 22 and 21 connecting the clock 6 in the digital signal processor 3 with the clock inputs 9 and 10 respectively may be wire connection or a fiber optic connection. Alternatively, as shown in FIG. 3, the connection may be an electromagnetic wireless connection, where the digital signal processor transmits the clock signal via an electromagnetic transmitter 9 and the PWM power processing devices (1 and 2) receive the clock signals at their clock inputs which are electromagnetic receivers (9 and 10 respectively).

In closing, it is noted that specific illustrative embodiments of the invention have been disclosed hereinabove. However, it is to be understood that the invention is not limited to these specific embodiments. With respect to the claims, it is applicant's intention that the claims not be interpreted in accordance with the sixth paragraph of 35 U.S.C. § 112 unless the term "means" is used followed by a functional statement.

What is claimed is:

1. A system capable of synchronizing clock frequencies of power processing devices and digital signal processing devices, comprising:
   a first pulse width modulated (PWM) power processing device;
   a second pulse width modulated (PWM) power processing device;
   a digital signal processor having a clock within capable of generating the digital signal processor operational clock frequency;
   where the first and second PWM power processing devices are connected to the clock;
   where the first and second PWM power processing devices use the clock for their operational clock frequency; and
   where the first PWM power processing device is a PWM power supply.

2. A system according to claim 1, where the first PWM power processing device provides power to the digital signal processor.

3. A system according to claim 1, where the second PWM power processing device is a PWM power amplifier.

4. A system according to claim 3, where the PWM power supply provides power to the PWM power amplifier and the PWM digital signal processor.

5. A system according to claim 1, where the clock operates at 96 kHz.

6. A system according to claim 3, where the PWM power amplifier provides power to a loudspeaker.

7. A system capable of synchronizing clock frequencies of power processing devices and digital signal processing devices, comprising:
   a first pulse width modulated (PWM) power processing device;
   a second pulse width modulated (PWM) power processing device;
   a digital signal processor having a clock within capable of generating the digital signal processor operational clock frequency;
   where the first and second PWM power processing devices are connected to the clock;
   where the first and second PWM power processing devices use the clock for their operational clock frequency; and
   where the clock has a clock frequency that is used by the digital signal processor.

8. A system according to claim 7, where the digital signal processor uses a multiple of the clock frequency for its operation.

9. A system according to claim 7, where the digital signal processor uses an integer fraction of the clock frequency for its operation so that the sum and difference frequencies fall outside of the audible frequency range.

10. A system according to claim 7, where the digital signal processor uses integer related derivatives of the clock frequency for its operation.

11. A system for synchronizing clock frequencies of power processing devices and digital signal processing devices, comprising:
- a first pulse width modulated (PWM) power processing device;
- a second pulse width modulated (PWM) power processing device;
- a digital signal processor having a clock within capable of generating digital signal processor operational clock frequency;
- where the first and second PWM power processing devices are connected to the clock;
- where the first and second PWM power processing devices use the clock for their operational clock frequency; and
- where the first and second PWM power processing devices use a multiple of the clock frequency for its operation.

12. A system for synchronizing clock frequencies of power processing devices and digital signal processing devices, comprising:
- a pulse width modulated (PWM) power processing device;
- a digital signal processor having a clock capable of generating digital signal processor operational clock frequency;
- where the PWM power processing device is connected to the clock;
- where the PWM power processing device uses the clock for its operational clock frequency; and
- where the PWM power processing devices uses an integer fraction of the clock frequency for its operation.

13. A system for synchronizing clock frequencies of power processing devices and digital signal processing devices, comprising:
- a pulse width modulated (PWM) power processing device;
- a digital signal processor having a clock capable of generating the digital signal processor operational clock frequency;
- where the PWM power processing device is connected to the clock;
- where the PWM power processing device uses the clock for its operational clock frequency; and
- where the PWM power processing device uses integer related derivatives of the clock frequency for its operation so that the sum and difference frequencies fall outside of the audible frequency range.

14. A system for synchronizing clock frequencies of power processing devices and digital signal processing devices, comprising:
- a pulse width modulated power (PWM) supply;
- a PWM power amplifier; and
- a digital signal processor, including:
- a clock where the PWM power supply is connected to the clock in the digital signal processor;
- where the PWM power amplifier is connected to the clock in the digital signal processor;
- where the digital signal processor and the PWM power supply and the PWM power amplifier use the clock in the digital signal processor for its operational clock frequency.

15. A system according to claim 14, where the PWM power supply provides power to the PWM power amplifier and the digital signal processor.

16. A system according to claim 14, where the clock in the digital signal processor operates at 96 kHz.

17. A system according to claim 14, where the PWM power amplifier provides power to a loudspeaker.

18. A system for synchronizing the clock frequencies for an audio electronic device, comprising:
- a digital signal processor (DSP) having a clock adapted to provide clock frequency for the operation of the DSP;
- a pulse width modulated (PWM) power supply operatively connected to the clock in the DSP;
- a PWM power amplifier operatively connected to the clock in the DSP; and
- where the PWM power supply and the PWM power amplifier use the clock in the DSP for their respective operational clock frequency.

19. The system according to claim 18, where the PWM power supply uses an integer multiple or integer fraction of the clock frequency of the clock within the DSP for its operation so that the sum and difference frequencies fall outside of the audible frequency range.

20. The system according to claim 18, where the PWM power amplifier uses an integer multiple or integer fraction of the clock frequency of the clock within the DSP for its operation so that the sum and difference frequencies fall outside of the audible frequency range.

21. A system for synchronizing clock frequencies, comprising:
- a clock, located within a digital signal processor, having a clock frequency;
- a pulse width modulated (PWM) power supply for powering a loudspeaker, where the PWM power supply uses the clock frequency for its operation; and
- a pulse width modulated (PWM) power amplifier that uses the clock frequency for its operation; and
- wherein said digital signal processor uses the clock frequency for its operation so that the PWM power supply, the PWM power amplifier and the digital signal processor run synchronously.

22. A system according to claim 21, where the PWM power processing device provides power to the digital signal processor.

23. A system according to claim 21, where the PWM power supply provides power to the PWM power amplifier and to the digital signal processor.

24. A system according to claim 21, where the clock operates at 96 kHz.

25. A system according to claim 21, where the digital signal processor uses a multiple of the clock frequency for its operation.

26. A system according to claim 21, where the digital signal processor uses an integer fraction of the clock frequency for its operation so that the sum and difference frequencies fall outside of the audible frequency range.

27. A system according to claim 21, where the digital signal processor uses integer related derivatives of the clock frequency for its operation.

28. A system according to claim 21, where the PWM power processing device uses a multiple of the clock frequency for its operation.

29. A system according to claim 21, where the PWM power processing device uses an integer fraction of the clock frequency for its operation.

30. A system according to claim 21, where the PWM power processing device uses integer related derivatives of the clock frequency for its operation so that the sum and difference frequencies fall outside of the audible frequency range.

* * * * *